United States Patent [19]
Wirth et al.

[11] Patent Number: 5,270,657
[45] Date of Patent: Dec. 14, 1993

[54] SPLIT GRADIENT AMPLIFIER FOR AN MRI SYSTEM

[75] Inventors: William F. Wirth, Sullivan; Thomas G. McFarland, Hartland; Robert M. Vavrek, Waukesha, all of Wis.; Peter B. Roemer, Schenectady, N.Y.; Otward M. Mueller, Ballston Lake, N.Y.; John N. Park, Rexford, N.Y.

[73] Assignee: General Electric Company, Milwaukee, Wis.

[21] Appl. No.: 965,131

[22] Filed: Oct. 22, 1992

Related U.S. Application Data

[63] Continuation-in-part of Ser. No. 854,736, Mar. 23, 1992.

[51] Int. Cl.$^5$ .............................................. G01V 3/00
[52] U.S. Cl. ...................................... 324/322; 324/318
[58] Field of Search ............... 324/322, 318, 307, 309, 324/300; 323/242, 247, 282, 350; 128/653.5

[56] References Cited

U.S. PATENT DOCUMENTS

| | | | |
|---|---|---|---|
| 4,437,053 | 3/1984 | Bax | 323/350 |
| 4,668,904 | 5/1987 | Kupiainen | 323/350 |
| 4,916,395 | 4/1990 | Usui | 324/318 |
| 5,017,871 | 5/1991 | Mueller et al. | 324/318 |
| 5,045,990 | 9/1991 | Stanley | 363/43 |
| 5,066,914 | 11/1991 | Vavrek et al. | 324/309 |

*Primary Examiner*—Louis Arana
*Attorney, Agent, or Firm*—Quarles & Brady

[57] ABSTRACT

A gradient amplifier for use in magnetic resonance imaging equipment employs a low voltage DC power supply connected in series between a pair of higher voltage DC power supplies, the latter supplies serving to provide increased power for rapid gradient switching and the former supply providing correction current to produce the desired voltage output. The high voltage DC power supplies preferably comprise multiple DC units which can be combined to provide finer steps of control prior to correction by the lower voltage supply. The low voltage DC power supply preferably comprise one or more linear amplifiers connected in series, or one or more switchmode amplifiers connected in series. The DC power supplies are controlled in an open loop manner from a gradient signal that designates the desired current for the gradient coil and the amplifiers are operated in a closed loop responding to to a feedback signal from the gradient coil.

25 Claims, 10 Drawing Sheets

SPLIT GRADIENT AMPLIFIER FOR AN MRI SYSTEM

This application is a continuation in part of U.S. patent application Ser. No. 07/854,736 filed on Mar. 23, 1992.

BACKGROUND OF THE INVENTION

This invention relates to magnetic resonance imaging apparatus and more specifically to high current, gradient power supplies for use in such apparatus.

Magnetic resonance imaging ("MRI") has developed as an important tool in diagnostic medicine. In MRI, as is understood by those skilled in the art, a body being imaged is held within a uniform magnetic field oriented along a Z-axis of a Cartesian coordinate system.

The spins of the nuclei of the body are excited into precession about the z-axis by means of a radio frequency (RF) pulse. The decaying precession of these excited spins produces a nuclear magnetic resonance (NMR) signal whose amplitude is dependant, among other factors, on the number of precessing nuclei per volume within the imaged body. This number of spins is termed the "spin density".

An image of the spin density, or other characteristics revealed by the NMR signal, may be produced by impressing precisely controlled magnetic gradient fields $G_x$, $G_y$, and $G_z$ along the X, Y and Z axes. These gradient fields, created by gradient coils driven by a gradient amplifier system, encode position information into the NMR signals through phase and frequency shifting of the NMR signal for spins in different locations.

Referring to FIG. 1, a typical "spin echo" pulse sequence for acquiring data under the spin warp MRI technique includes: 1) a Z-axis gradient $G_z$ activated during a first 90° RF pulse to select the image slice in the Z-axis, 2) a Y-axis gradient field $G_y$ to phase encode the precessing nuclear spins in the y direction, and 3) an X-axis gradient $G_x$ activated during the acquisition of the NMR signal to frequency encode the precessing nuclear spins in the x direction. Two such NMR acquisitions, $S_1$ and $S_1'$, the latter inverted and summed with the first, comprise the NMR signal of a single view "A" under this sequence. Note that the y gradient field $G_y$ changes between view "A" and subsequent view "B". This pulse sequence is described in detail in U.S. Pat. No. 4,443,760, entitled: "Use of Phase Alternated RF Pulses to Eliminate Effects of Spurious Free Induction Decay Caused by Imperfect 180 Degree RF Pulses in NMR Imaging", and issued Apr. 17,1984, assigned to the same assignee as the present invention and incorporated by reference.

A set of NMR signals comprised of many views may be "reconstructed" to produce an image of a single slice of an imaged object according to well understood techniques. Multiple slices are needed to generate information over three dimensions of the imaged object.

The speed with which slice images may be obtained is limited, to a large extent, by the speed with which the gradient fields may be changed. The gradient coils are substantially inductive loads and hence obtaining higher speed switching of the gradient fields requires amplifiers capable of producing correspondingly higher voltages, often on the order of 2,000 volts. These higher voltages, together with the high currents required by the gradient coils (of 200 Amperes or more), demand amplifiers capable of extremely high power output.

The gradient amplifiers must also be capable of accurate control of the gradient current delivered to the gradient coils and should allow the maximum possible flexibility in the generation of gradient waveforms of arbitrary shape for present and future imaging techniques. For this reason, high powered linear amplifiers are most commonly used.

Previously, the power supply for a gradient coil utilized a single voltage inverter. Because of the relatively high voltages being switched, the single inverter had to use transistors capable of handling such voltages. It is desirable to be able to switch the high voltage with lower rated transistors.

SUMMARY OF THE INVENTION

This invention relates to a gradient amplifier system in which DC power supplies are connected in tandem with conventional linear gradient amplifiers to boost the effective gradient power to the gradient coils.

Specifically, a DC power supply receiving a gradient signal has an output connected to the gradient coil for generating a first voltage component, selectable from a discontinuous range of output voltages, and approximating a desired magnetic gradient field. A feedback sensor is connected to the gradient coil for producing a feedback signal which is used to control an amplifier. The amplifier has an output also connected to the gradient coil for generating in the gradient coil a second voltage component, but within another continuous range of output voltages. The feedback signal and the gradient signal are used by the amplifier to adjust the second voltage component so that the sum of the first and second voltage components provides the desired magnetic gradient field.

It is thus one object of the invention to obtain the power efficiency and simplicity of using a DC source to drive a gradient coil, while still maintaining the ability to precisely generate arbitrary waveforms. DC power supplies may employ relatively simple construction or may operate with extremely low power dissipation. The amplifier serves to "fill in" the stepped output of the DC power supply to provide effective linear control. The correction provided by the amplifier permits the DC power supplies to have relatively little internal regulation. In fact, the DC power supplies may be no more than charged capacitors, provided the amplifier has the range to compensate for their varying output.

It is another object of the invention to take advantage of the intermittent power demands of gradient coils. The DC power supplies provide power for peak demand and may accumulate energy in storage capacitors or the like, at other times to thus require lower powered components.

In one embodiment, the DC power supply may be constructed of multiple DC sources, each source providing an incremental voltage to the gradient coils together to offer several output voltage levels. The values of the voltages from each DC source may stand in binary relationship with the voltages of the other sources. The gradient current is, in either case, generated by switching the appropriate combination of DC sources together.

It is thus another object of the invention to provide a plurality of DC sources that may, together, better approximate the voltage needed to generate the desired gradient current, thereby allowing the amplifier to be correspondingly reduced in power output.

In one embodiment the DC power supplies may include large storage capacitors capable of receiving energy from the inductive gradient coils when the gradient field is reduced.

It is another object of the invention, therefore, to take advantage of the inductive, energy storing nature of the gradient coils. The peak power demanded of the gradient amplifiers is during periods when the gradient strength must be changed. In these periods, energy is added to or subtracted from the energy stored in the gradient coils. The use of capacitors in the output of the DC power supplies allows this stored energy to be recaptured from the gradient coils during periods when the gradient coil strength is being reduced and added again during periods when the gradient signal is being increased.

Not all energy may be successfully recaptured from the gradient coils by the storage capacitors. Therefore, they soon need supplemental recharging.

In a further embodiment, the storage capacitors may be recharged by the amplifier during the changing of the gradient level. A capacitor reference voltage is used to indicate a desired peak capacitor voltage corresponding to a first gradient current flow. A sample of the peak voltage on the capacitor is used to produce a peak voltage signal which together with the reference voltage generates an error signal. The error signal produces a current to add to the first and second currents in the gradient coil, to move the peak capacitor voltage toward the value of the reference voltage.

Thus it is yet another object of the invention to eliminate the need for supplemental recharging circuitry in the DC power supplies, but to use the amplifier itself for the purpose of making up the charge lost in the DC power supply capacitors.

Other objects and advantages besides those discussed above shall be apparent to those experienced in the art from the description of a preferred embodiment of the invention which follows. In the description, reference is made to the accompanying drawings, which form a part hereof, and which illustrate one example of the invention. Such example, however, is not exhaustive of the various alternative forms of the invention, and therefore reference is made to the claims which follow the description for determining the scope of the invention.

DETAILED DESCRIPTION OF THE PREFERRED EMBODIMENTS

MRI System Hardware

Figure 1:
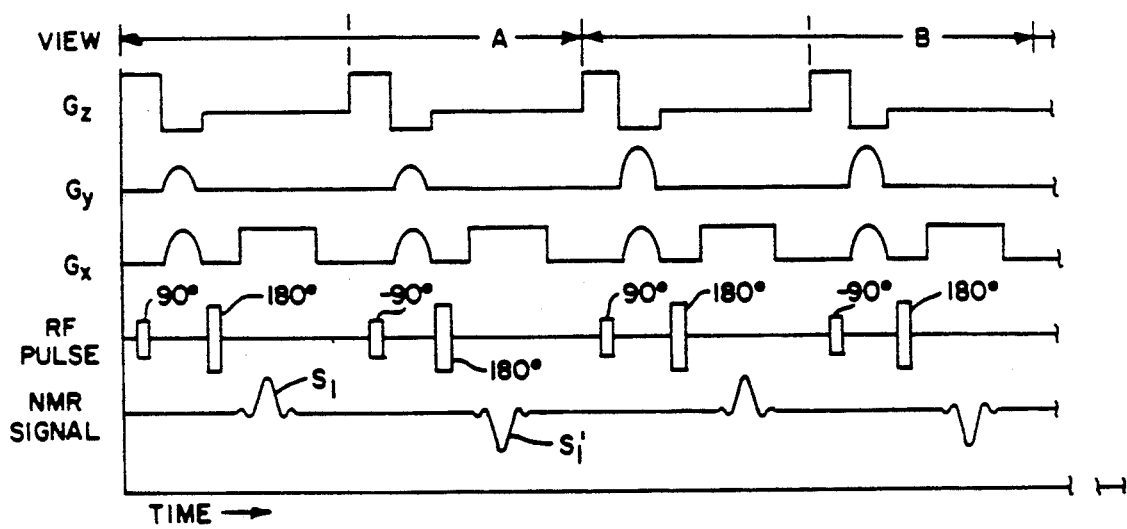
FIG. 1 is a graphical representation of an MRI pulse sequence showing gradient field waveforms $G_x$, $G_y$, and $G_z$.
Figure 2:
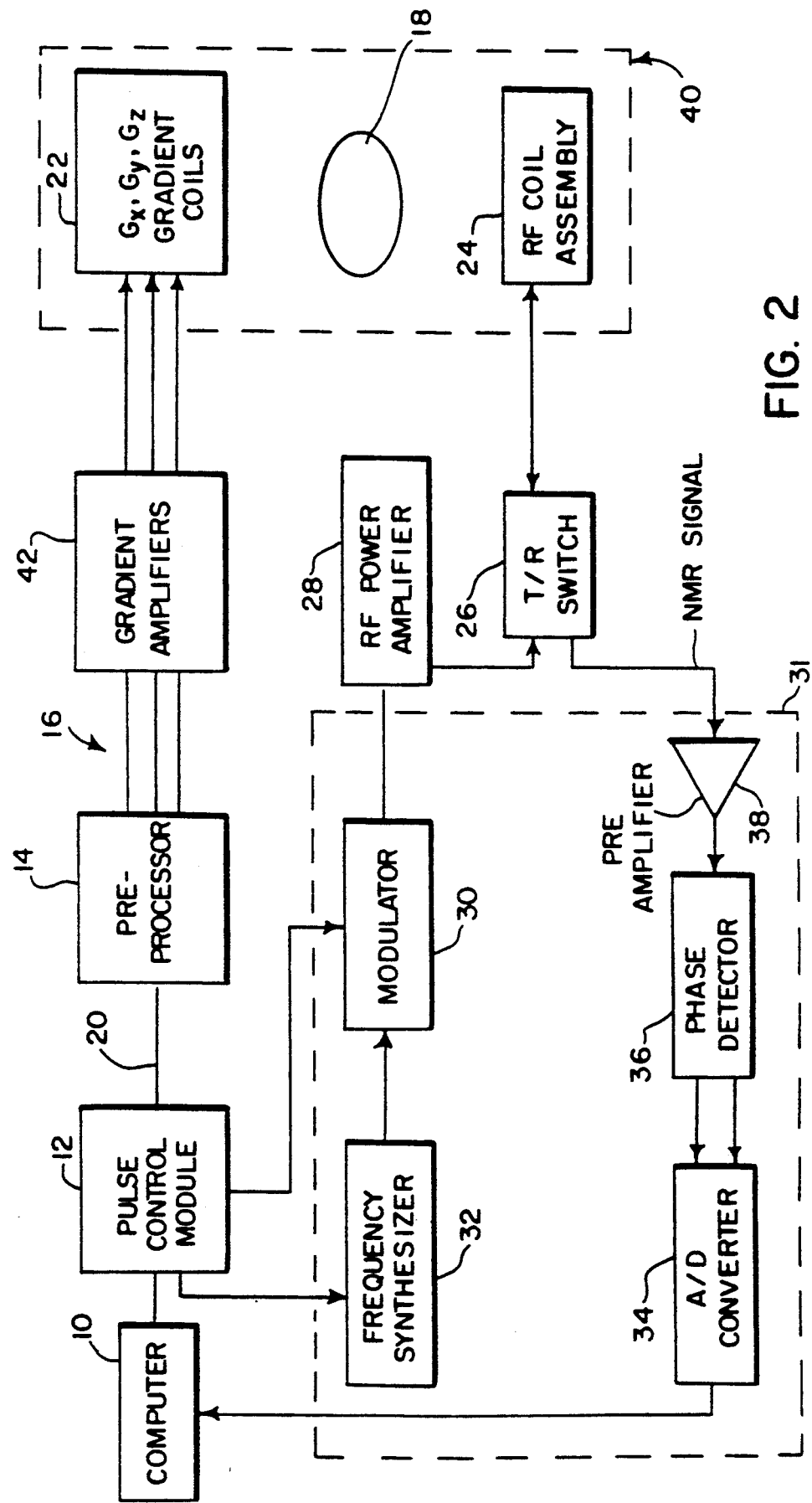
FIG. 2 is a block diagram of an MRI apparatus incorporating the amplifiers of the present invention.

Referring to FIG. 2, the RF and gradient field signals used in MRI pulse sequences, such as that shown previously in FIG. 1 for spin warp imaging, are generated by a pulse control module 12 which synthesizes properly timed pulse sequences under the control of a computer 10.

The pulse control module 12 communicates by means of a digital signal 20 to a gradient waveform preprocessor 14 which converts the digital signal into three analog gradient signals 16, one for each gradient axis. The analog gradient signals 16 are communicated to a set of three identical gradient amplifier systems 42 each connected to a gradient coil within assembly 23 to produce the gradient fields $G_x$, $G_y$, and $G_z$ as described above.

Each gradient coil in assembly 23 consists of a number of turns of a copper conductor and is arranged in proximity to a patient 18 in the magnet assembly 40. The magnet assembly 40 also contains the superconducting magnet for producing the polarizing field $B_0$ as is generally described in U.S. Pat. No. 4,737,716 entitled: "Self-Shielded Gradient Coils For Nuclear Magnetic Resonance Imaging" issued Aug. 12, 1988, assigned to the same assignee as the present invention and incorporated herein by reference.

The pulse control module 12 also controls a radio frequency synthesizer 32, which is part of an RF transceiver, portions of which are enclosed by block 31. The pulse control module 12 additionally controls an RF modulator 30 which modulates the output of the radio frequency synthesizer 32. The resultant RF signals, amplified by power amplifier 28 and applied to RF coil 24 through transmit/receive switch 26, are used to excite the nuclear spins of the imaged patient 18.

The NMR signals from the excited nuclei are picked up by the RF coil 24 in the magnet assembly 40 and presented to preamplifier 38 through transmit/receive switch 26, to be amplified and then processed by a quadrature phase detector 36. The detected signals are digitized by a high speed A/D converter 34 and applied to computer 10 for processing to produce images of the patient 18.

Gradient Amplifiers

Figure 3:
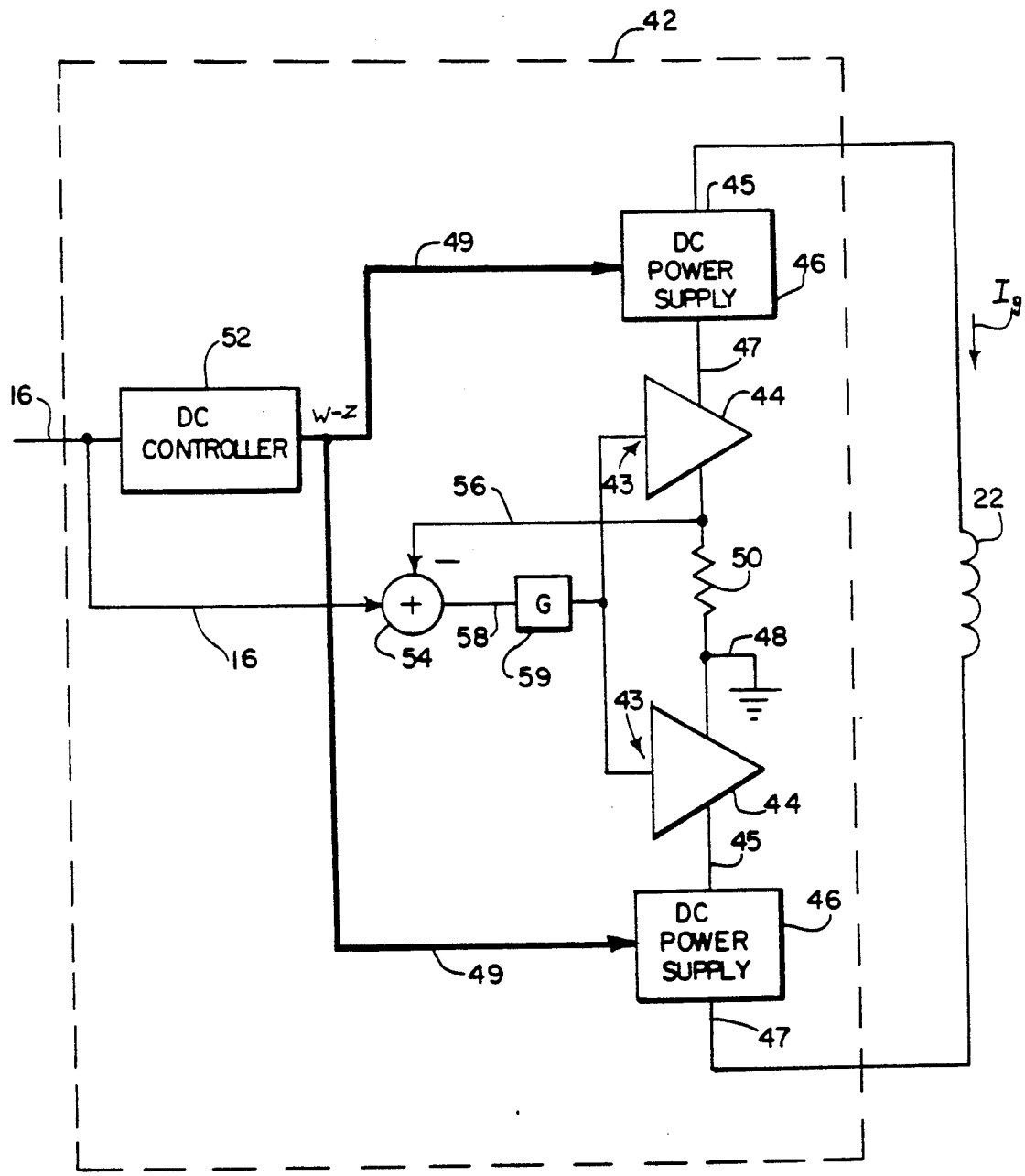
FIG. 3 lied block diagram of one of the gradient amplifiers of FIG. 2 showing the interconnections between amplifiers and DC power supplies.

Referring now to FIGS. 2 and 3, each gradient amplifier 42, associated with a particular gradient coil 22 within assembly 23 for the three gradient axes Gx, Gy and Gz, includes a series connected chain of two linear amplifiers 44 and two DC power supplies 46. This series connected chain is, in turn, connected across a gradient coil 22 to provide power to that coil. Each linear amplifier 44 provides a voltage output that is a simple multiplicative scaling of an analog signal at its input 43. Further, the output of the linear-amplifier 44 is substantially continuous, that is, the output is not subject to movement in discrete steps but is controllable, by the signals at its input 43, to an arbitrary value within the output range of the linear amplifier. Each linear amplifier 44 is designed in bridge configuration to have a "floating output". That is, it produces an output voltage defined with respect to two terminals neither of which is referenced to a ground that is common with the other circuit elements of the gradient amplifier 42. The floating output allows the voltage output of the linear amplifier 44 to be added to other voltage sources simply by connecting it in series with such other sources. Linear amplifiers 42 are known in the art and are described in U.S. Pat. No. 3,808,545 entitled: "High Power Bridge Audio Amplifier" which description is incorporated herein by reference.

The DC power supplies 46, as will be described in more detail below, provide only discrete steps of output voltage and thus may be contrasted to the linear amplifiers 44 by the fact that their outputs are not a continuous function of an input value. In a simplest embodiment, the DC power supplies 46 are capable of only three voltage outputs: zero volts and a predetermined voltage of either of two polarities.

Like the linear amplifiers 44, the DC power supplies 46 have floating outputs producing voltages defined between first and second output terminal 45 and 47 respectively. The DC power supplies 46 do not have inputs, in the sense of the linear amplifiers 44, but receive an activation and polarity signal which determines the polarity of the output voltage produced across the terminals 45 and 47 of the DC power supply 46, or, in one embodiment to be described below, selects from one of several discrete output voltage values.

As mentioned, the two linear amplifiers 44 and the pair of DC power supplies 46 are connected in series across the gradient coil 22. The linear amplifiers 44 and DC power supplies 46 are also paired symmetrically about a ground point 48 so as to drive the gradient coil 22 symmetrically about that ground point 48. This arrangement serves to minimize the voltage swing between any part of the gradient coil 22 and the ground, during the driving of the gradient coil 22, and thus reduces the effects of capacitive coupling between the gradient coil 22 and objects such as the patient 18 or the superconducting magnet which are at fixed voltage with respect to ground. Each DC power supply 46 receives the same input 43 and each linear amplifier 44 receives the same activation and polarity signal to provide this symmetry.

A current sensing resistor 50 is inserted in series between one linear amplifier 44 and the ground point 48 to provide a voltage drop indicative of the current flow through the series connected DC power supplies 46, linear amplifiers 44 and gradient coil 22. The value of resistor 50 is sufficiently low so as not to substantially effect the symmetrical application of voltage to the gradient coil 22 as described above. The purpose of the current sensing resistor 50 is to provide an indication on line 56 of the actual gradient field produced. As such, it will be understood to those of ordinary skill in the art that other current sensors may be used including those from Hall effect transducers or DC transformers.

The series connection of the DC power supplies 46 and the linear amplifiers 44, as described above, combines the advantages of each power source. The linear amplifiers 44 provide accurate and continuous regulation of the current through the gradient coil 22, particularly needed during the periods of collection of the NMR data, while the DC power supplies provide a relatively inexpensive and reliable source of high voltage necessary to rapidly switch the gradient currents against the inductive load of the gradient coil 22. The linear amplifiers 44 serve to "fill-in" for voltage values between those provided by the DC power supplies 46 and to effectively regulate the combined voltage as will be described below.

The coordination of the DC power supplies 46 and the linear amplifiers 44 is provided by the combined action of an open-loop DC controller 52 and closed-loop current feedback employing summing node 54. The analog gradient signal 16, reflecting the desired current through gradient coil 22 is received both by the DC controller 52 and the summing node 54. As will be described in more detail below, based on the gradient signal 16, the DC controller 52 controls the polarity and discrete voltage of the DC power supplies 46 to provide an approximation of the necessary voltage needed to drive the required current through the gradient coil.

A current feedback signal 56 derived from the current sensing resistor 50 is subtracted from the same gradient signal 16 to produce an error signal 58 according to conventional feedback control. This error signal 58 represents the difference between the current Ig through the gradient coil 22 and the desired current as indicated by the gradient signal 16. This error signal 58, after passing through gain block 59, is input to the linear amplifiers 44. The gain block provides the necessary signal amplification and compensation to satisfy amplifier stability criteria such as are understood in the art. The linear amplifiers 44 provide a voltage output supplementing that of the DC power supplies 46 and modifying the current flow through the gradient coil 22 to reduce the error signal 58 to zero. The error signal 58 thus brings the current Ig through the gradient coil to the desired value reflected in the gradient signal 16.

Thus, the DC power supplies 46 are controlled directly by the gradient signal 16 without regard to the actual current flowing through the gradient coil 22, and the linear amplifiers 44 are controlled by the actual current flowing through the gradient coils 22 to make up whatever difference is required to bring that current to the proper level. The linear amplifiers 44 sense the gradient coil current through feedback resistor 50.

In order that the two sources of gradient power, the DC power supplies 46 and the amplifiers 44, operate effectively together, the unit of voltage which may be applied to the gradient coil 22 by each DC power supply 46 is limited to a value less than the maximum output voltage of the linear amplifier 44. This ensures that the combination of the linear amplifiers 44 and the DC power supplies 46 can provide a continuously varying controlled voltage anywhere within a range from zero volts to a maximum equal to the sum of the maximum output voltages of the linear amplifiers 44 and DC power supplies 46.

Figure 4:
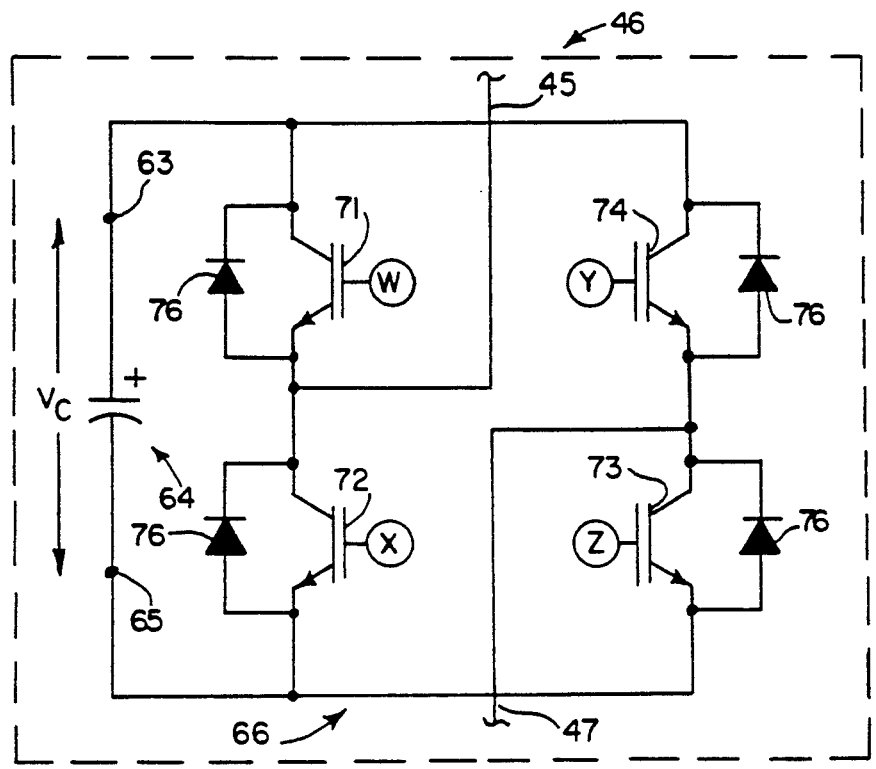
FIG. 4 is a schematic diagram of a first embodiment of the DC power supplies of FIG. 3, showing the positioning of an energy storage capacitor bank.

Referring now to FIGS. 3 and 4, in a first embodiment, each DC power supply 46 includes a capacitor bank 64 which is precharged to a capacitor standby voltage by a low powered charger (not shown) measured between a positive terminal 63 and negative terminal 65. This capacitor bank 64 is connected, through a switching network 66 to the first and second terminals 45 and 47 of the DC power supply 46.

The switching network 66 includes four power transistors 71, 72, 73 and 74, such as N-channel IGBT type devices, which are arranged to connect the capacitor bank 64 in series with the gradient coil 22 in either of two polarities, i.e. so that the first terminal 45 of the DC power supply 46 is either: 1) more positive than the second terminal 47 (the "positive polarity") or 2) more negative than the second terminal (the "negative polarity"). The transistors 71-74 of the switching network 66 may also be controlled so as to disconnect the capacitor bank 64 from the gradient coil 22 and to connect together the first and second terminals 45 and 47 of the DC power supply 46, producing zero output voltage (the "shorted" state).

In the network, transistors 71 and 72 are connected across the capacitor bank 64, with the collector of transistor 71 connected to the positive tern-Linal 63 of the capacitor bank 64 and its emitter connected to the collector of transistor 72 and to the first terminal 45 of the DC power supply output 46. The emitter of transistor 72 is then connected to the negative terminal 65 of the capacitor bank 64. Likewise transistors 73 and 74 are also connected in series across the capacitor bank 64, with the collector of transistor 74 connected to the more positive terminal 63 of the capacitor bank 64 and its emitter connected to the second terminal 47 of the DC power supply 46 and to the collector of transistor 73. The emitter of transistor 73 is in turn connected to the negative terminal 65 of the capacitor bank 64.

Each of transistors 71-74 has a diode 76 arranged to conduct current from the emitter of each transistor to its collector. It will be understood from this description that these diodes 76 thus form a full wave rectifier bridge, each leg of the bridge having one transistor 71-74 bridging that leg.

The base of each transistor 71-74 may be biased "ON" or "OFF" to produce the negative polarity, positive polarity and shorted states described above. This biasing is shown in Table I where the letters W, X, Y and Z identify the bases of transistors 71-74 respectively.

TABLE I

| STATE | W or J | X or K | Y or L | Z or M |
| --- | --- | --- | --- | --- |
| Negative Polarity | OFF | ON | ON | OFF |
| Positive Polarity | ON | OFF | OFF | ON |
| Shorted (1) | OFF | ON | OFF | ON |
| Shorted (2) | ON | OFF | ON | OFF |
| OFF | OFF | OFF | OFF | OFF |

Thus, the switching network 66 allows the voltage of the capacitor bank 64 to be selectively applied to the gradient coil 22 to augment the voltage produced by the linear amplifiers 44. The transistors 71 through 74 operating largely either in a fully on or fully off state, consume little power (as opposed to the transistors of the linear amplifiers 44) and hence preserve the natural efficiency of the DC power supplies 46 in delivering power to the gradient coil 22.

Figure 5:
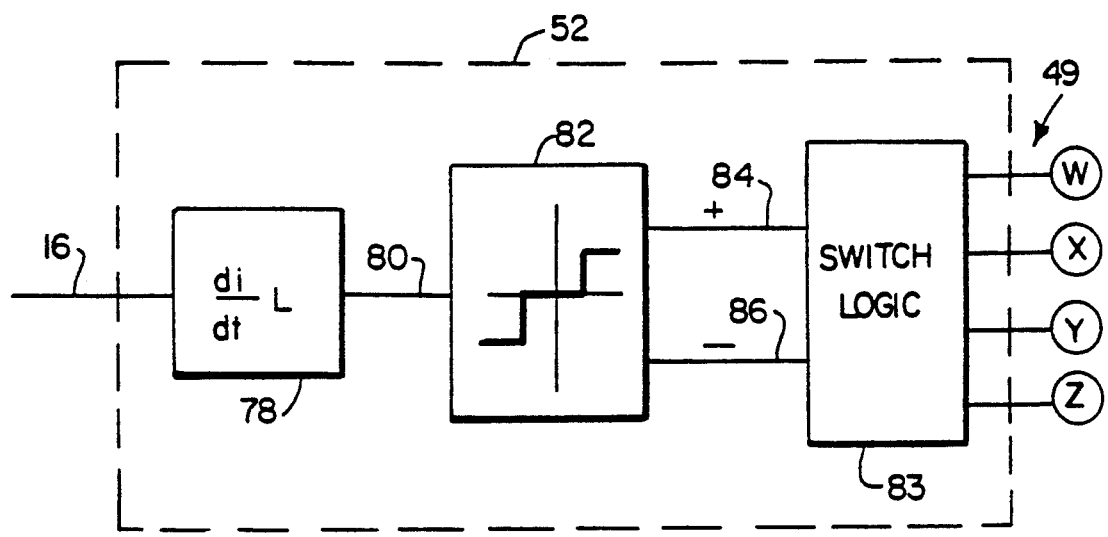
FIG. 5 is a block diagram of a controller for switching the DC power supply of FIG. 4 in response to a gradient signal.

Referring now to FIGS. 3, 4 and 5, the DC power supplies 46 of FIG. 4 are controlled by a DC controller 52 which produces the activation and polarity signals 49 made up of base driving signals for transistors 71 through 74 as detailed in Table I.

The DC controller 52 employs a differentiator 78, which receives the analog gradient signal 16 (indicating the desired current through gradient coil 22) and takes its derivative with respect to time. This derivative is multiplied by the impedance of the gradient coil 22 to produce an accelerating voltage 80 representing the voltage that would have to be applied to the gradient coil 22 to achieve the change in current through the gradient coil 22 dictated by the gradient signal 16. It will be understood that although the gradient coil 22 is modeled above as a simple inductance, that more complex models may readily be employed, such models including resistive and capacitive effects, the frequency dependance of the impedance, and capacitive and inductive coupling between the gradient coil 22 and the patient and magnet structure.

This accelerating voltage 80 is received by a two-step comparator 82 which produces a positive polarity signal 84 if voltage 80 is greater than or equal to the total precharged voltage of capacitor bank 64 times the number of DC power supplies 46. The two step comparator produces a negative polarity signal 86 if voltage value 80 is less than or equal to the negative of the total precharged voltage of capacitor bank 64 times the number of DC power supplies 46. For other voltages 80, the two step comparator 82 produces neither signal 84 or 86 which indicates a shorted condition of the DC power supply 46 is desired.

Switch logic 83 next interprets the positive and negative polarity signals 84 and 86 into base driving signals for transistors 71 through 74, of the switching networks 66, according to Table I. These base driving signals are the activation and polarity signals 49.

Thus, if the required voltage across the gradient coil 22 is at least as great as the precharge voltage which is provided (initially) by the DC power supplies 46, the DC power supplies 46 are connected to the gradient coil 22. Incremental voltages greater or less than the precharged voltage of the capacitor bank are provided by the linear amplifiers 44.

The capacitor bank 64 may both source and sink current to and from the gradient coil 22 so that at the conclusions of a gradient excitation, i.e., when the current through the gradient coil 22 is zero, the precharge voltage on the capacitor bank 64 is largely undiminished. The condition that the precharge voltage is undiminished strictly requires that the magnitude of the slope of the change in the gradient current be constant for changes in the gradient field. Even under these conditions, some diminution of charge occurs, however, because of the resistive component of the gradient coil 22 and other loss elements. Accordingly, the charge on the capacitor bank 64 must be augmented by some recharging of the bank from an external source. This external source may be a separate power supply, however, preferably, and if the DC power supply 46 is not sufficient alone to provide the change in gradient current, the linear amplifiers 44 are used. Restoration of the charge on capacitor bank 64, permits the assumption of a constant precharge voltage implicit in the calculation performed by the two step comparator 82 in deciding whether to switch the DC power supplies 46 into the circuit or not.

Figure 7A:
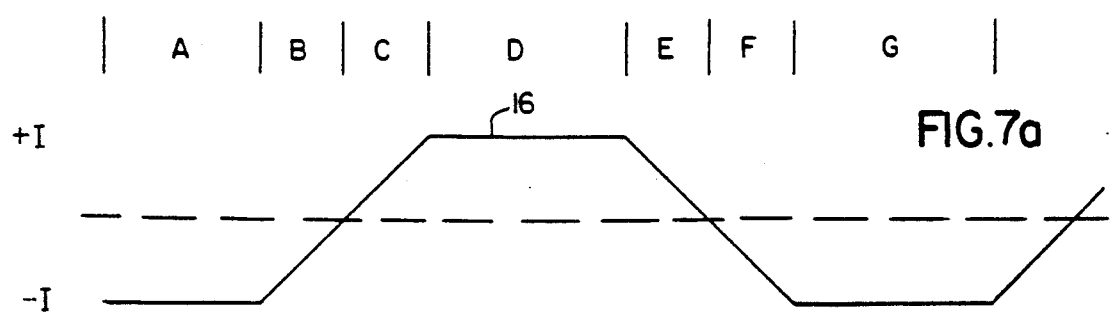
FIG. 7(a) is a graph of a hypothetical gradient signal input to the gradient amplifier of FIG. 4.
Figure 7B:
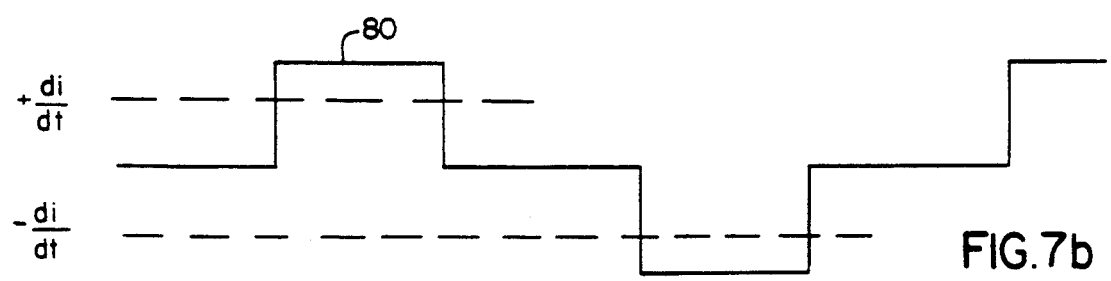
FIG. 7(b) is a graph of the derivative of the gradient signal of Figure 7(a) such as is used to control the DC power supply of FIG. 4.

Referring to FIG. 7(a) a gradient signal 16 may be divided into periods of constant gradient strength (hence constant current) A, D, and G and periods of transition or changing gradient strength B/C, and E/F. The derivative of the gradient signal 16, as produced by the differentiator 78 of FIG. 5, produces a voltage signal 80, shown in FIG. 7(b). The voltage signal 80 is related to the gradient signals 16, by having a value of zero for the constant periods A, D, and G and a finite magnitude for the transition periods BIC, and E/F. If the value of the voltage 80 during transition periods B/C, and E/F is sufficient, the DC controller 52 will connect the capacitor bank 64 to the gradient coil 22.

Figure 7C:
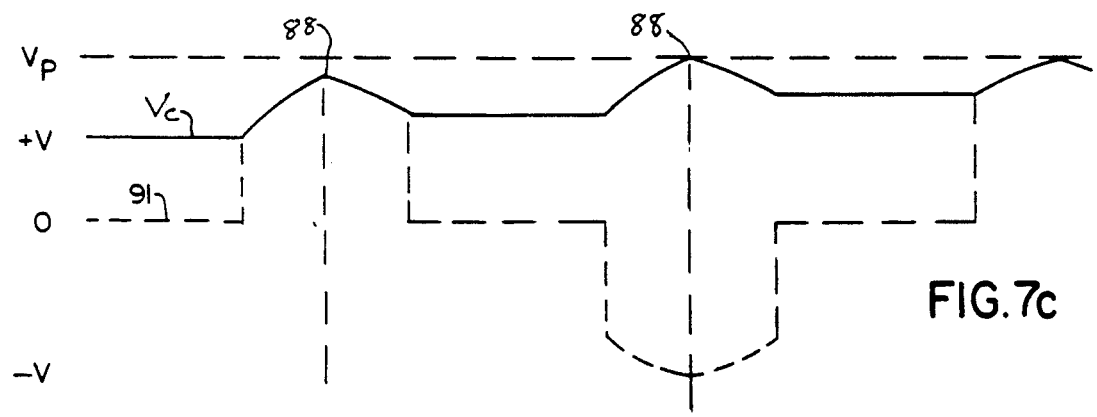
FIG. 7(c) is a graph of the voltage on the capacitor bank of the DC power supply of FIG. 4 for the gradient signal of FIG. 7(a)

Referring to FIG. 7(c), the voltage Vc on the capacitor bank 64, when it is connected to the gradient coil 22 at the start of a transition in periods B or E, rises toward the capacitor precharge voltage $V_p$ as the capacitor bank 64 is connected to oppose the voltage of the gradient coil 22 and receives current from the gradient coil 22. The voltage Vc on the capacitor bank 64 then peaks at points 88 as the current through the gradient coil 22 reaches zero (the energy of the gradient coil having been effectively transferred to the capacitor bank 64) and then begins to fall again as the current through the gradient coil 22 reverses direction and charge is drained from the capacitor bank 64 in periods C and F. The DC power supply 46 is then shunted so that the output voltage 91 drops to zero, however the voltage Vc on the capacitor bank 64 simply remains constant at a standby level. The difference in voltage between the capacitor precharge value Vp and the peak voltage at point 88, when gradient current is zero, represents the loss of charge in the capacitor bank 64 due to resistance of the gradient coil 22 and other loss mechanisms. This loss may be corrected, provided the voltage of the DC power supply is sufficient to handle the changes in gradient filed, by the linear amplifiers 44 by providing them with a correction signal 90, shown in FIG. 7(d) during the transition periods B/C, and E/F.

The correction signal 90 is summed to the error current 58 prior to it being received by the inputs 43 of the linear amplifiers 44 so that the voltage Vc on the capacitor bank 64 rises faster or slower during period B or E than it falls during periods C or F.

Specifically, the correction signal 90 comprises a triangle wave having a varying amplitude dependent on the difference between the precharge voltage Vp and the peak voltage at points 88 during the most recent transition between periods B and C, or E and F.

Figure 7D:
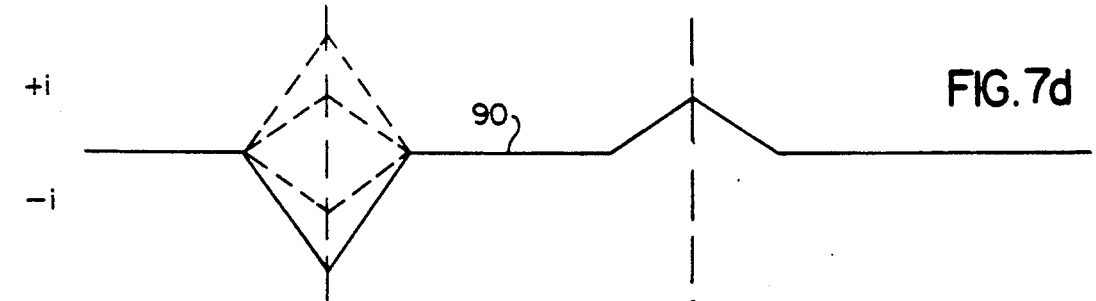
FIG. 7(d) is a graph of a current correction signal used to restore the charge of the capacitor bank of the DC power supply of FIG. 4 caused by resistive or other losses.
Figure 7E:
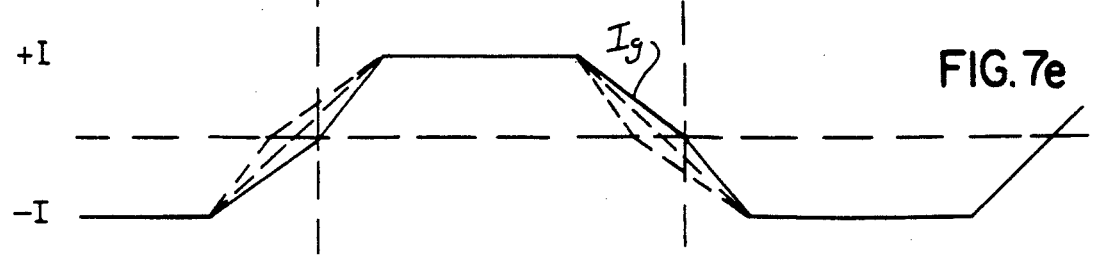
FIG. 7(e) is a graph of the gradient coil current produced by the gradient signal of FIG. 7(a) and the correction current of FIG. 7(d)

Referring to FIGS. 7(d) and 7(e), the correction signal 90, when summed with the error signal 58 alters actual gradient current Ig during the transition periods B/C, and E/F slightly, modifying the gradient current Ig from that dictated by the gradient signal 16. Nevertheless, it has been determined that this slight modification of the gradient waveform during transition periods B/C and E/F is acceptable in its effect on the fidelity of the produced NMR image and of no effect for many imaging techniques where NMR data is only taken during periods of constant gradient value A, D and G.

Referring again to FIG. 7(c), as the peak voltage at point 88 approaches the desired precharge voltage Vp of the capacitor bank 64, the triangle wave of the correction signal 90 decreases in amplitude so that the capacitor peak voltage 88 asymptotically approaches the desired precharge voltage Vp.

The capacitor precharge voltage Vp, as mentioned, affects the proper switching point of the DC power supplies 46 into the circuit as controlled by the two step comparator 82. Nevertheless, the inherent correction action of the feedback loop of linear amplifiers 44 reduces the importance of precisely regulating the capacitor peak voltage to equal the desired precharge voltage Vp.

Figure 6:
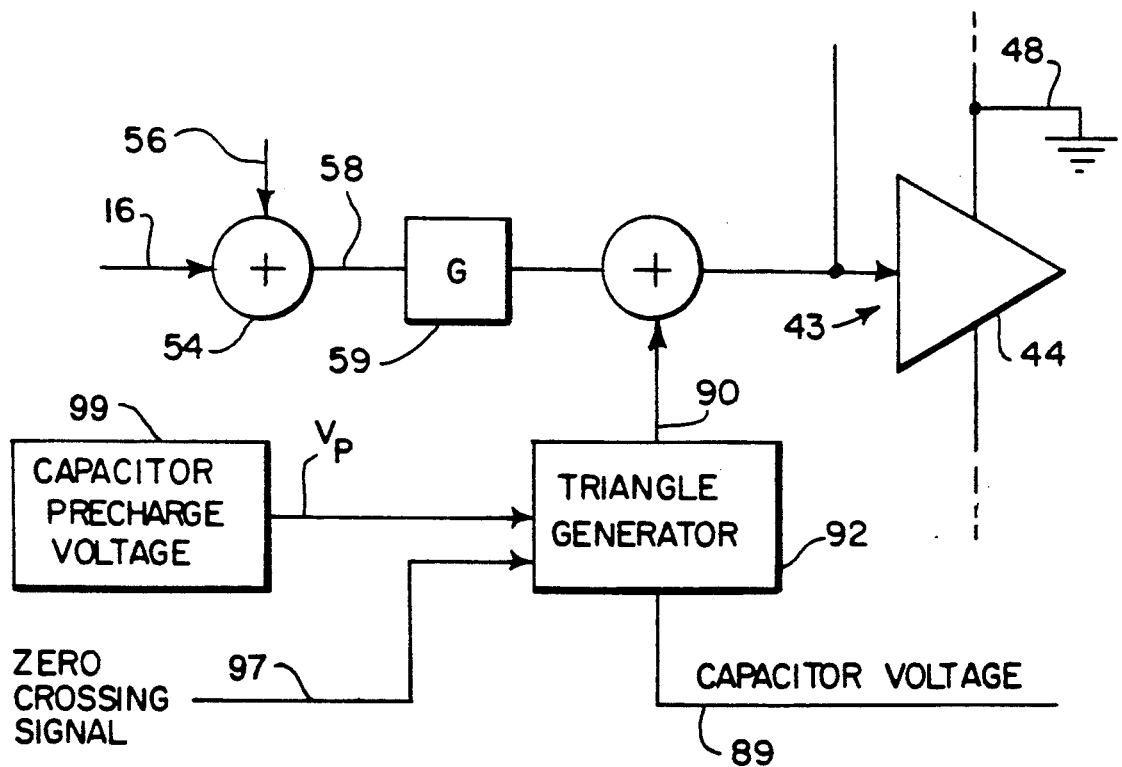
FIG. 6 is a block diagram of a capacitor voltage correction circuit used to control the amplifiers of FIG. 3 to recharge the capacitors of the DC power supply of FIG. 4.

Referring to FIG. 6, the correction signal 90 is produced by a triangle generator 92 generating the above described triangular waveform during transition periods B/C, and E/F. The capacitor voltage Vc on line 89 is sampled during the transition times of the gradient current Ig and compared to a reference supply 99 indicating the desired level of the capacitor precharge voltage Vp. The zero crossing signal 97 also provides polarity information to the triangle generator 92 to produce the proper polarity of triangle wave to correspond to the gradient signal 16 as shown in FIG. 7(a) and (d).

The correction signal 90 produced by the triangle generator 92 is summed to the error signal 58 and the sum provided to the inputs 43 of the linear amplifiers 44.

Figure 8:
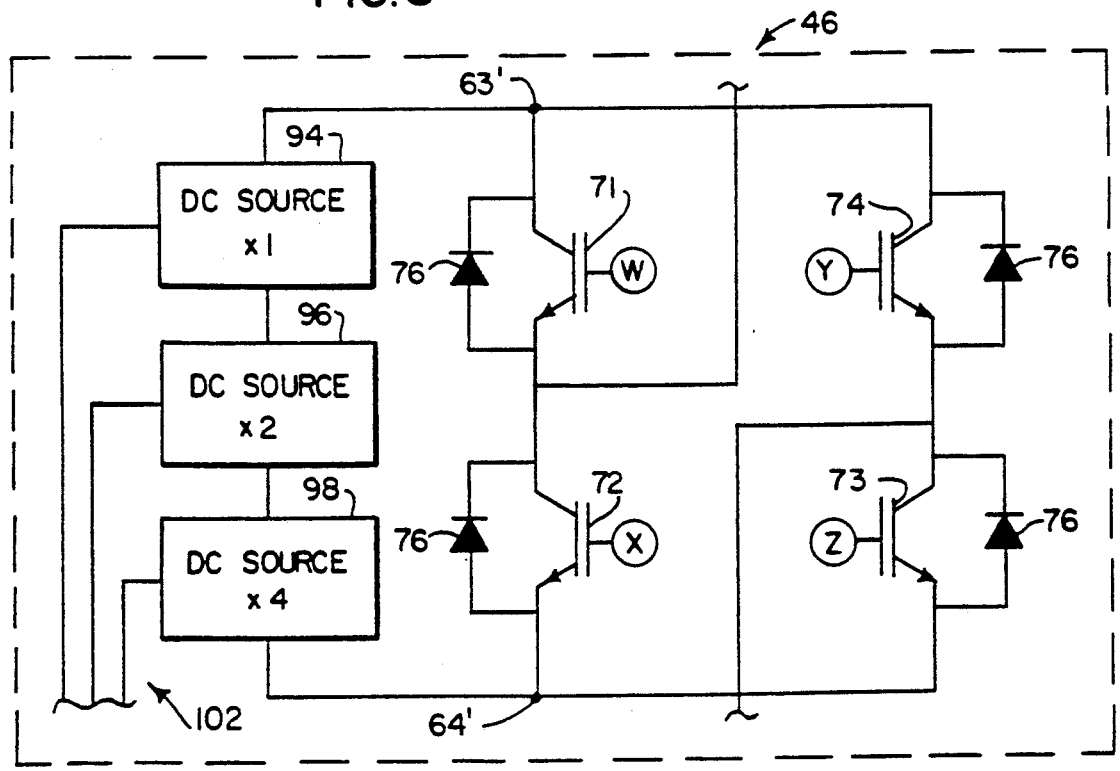
FIG. 8 is a schematic diagram of a second embodiment of the DC power supplies of FIG. 3, showing the use of multiple DC sources having binary weighted outputs.

Referring now to FIG. 8, in a second embodiment, the capacitor bank 64 is replaced with three series connected DC sources 94, 96 and 98 together to provide a voltage across terminals 63' and 64', where terminal 63' is the more positive terminal of the two. Each DC source 94-98 provides either a positive voltage weighted according to a binary weighting scheme or a shorted state of zero voltage. In the shorted state, the DC voltages 94-98 present a zero resistance across their terminals to transmit the voltage of the other series connected sources. Thus, combinations of the DC sources 94-98 either at their positive voltage values or shorted may produce a range of equally stepped voltages from zero to the sum of their positive voltages. The DC sources 94-98 are conventional "four quadrant" floating power supplies having transistors which disconnect their outputs from power and short those output when they are in the shorted state.

The weighting of the DC sources 94-98 is such that the voltage of DC source 96 is twice that of DC source 94 and the voltage of DC source 98 is four times that of the DC source 94. The DC power supply 46 may thus produce not one but eight equally spaced discrete voltage levels and, by means of switching network 66, two polarities. Nevertheless, the DC power supply 46 using the DC sources 94-98 still produces a discontinuous output which must be corrected to conform to the precise gradient signal 16 by the linear amplifiers 44.

Figure 9:
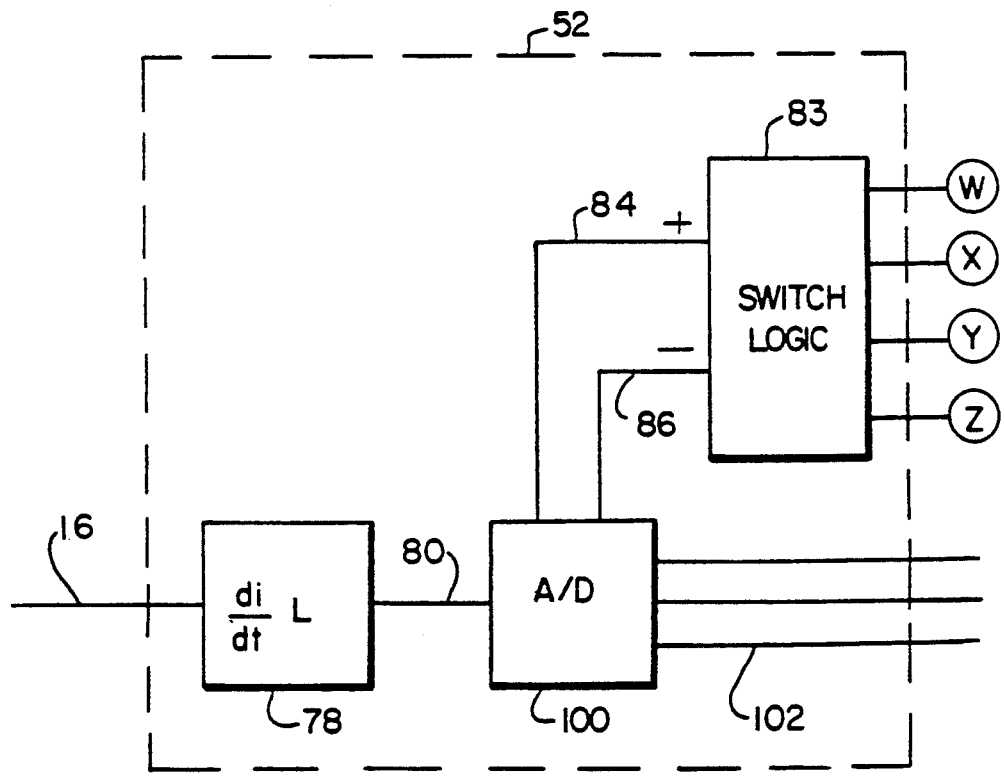
FIG. 9 is a block diagram of a controller for switching the DC power supply of FIG. 8 in response to a gradient signal.

Referring to FIG. 9, the control of the DC sources 94-98 of FIG. 8 is accomplished by a modified DC controller 52 receiving the analog gradient signal 16. The gradient signal 16 is again differentiated by differentiator 78 and multiplied by the inductance of the gradient coil 22 to produce an accelerating voltage 80.

The voltage 80, which is equal to the voltage that must be applied across the gradient coil 22 to achieve the desired gradient current, is received by a three bit analog-to-digital converter 100. The analog-to-digital converter 100 converts the voltage 80 into a three bit digital word 102, one bit of which controls each of the DC sources 94–98. Specifically, one bit of the three bit word 102 is connected to one of the three DC sources 94–98 with the most significant bit of the three bit word 102 controlling DC source 98. Each DC source 94–98 provides a shunted zero volt output when corresponding bit of word 102 is in the "false" state and a positive voltage output when the corresponding bit of word 102 is in the "true" state.

The analog-to-digital converter 100 also produces polarity signals 84 and 85 to control the switching network 66, and indicating whether the voltage 80 is greater than or less than zero volts. Such polarity signals driving switch logic 83, as before, to control the switching network 66 of the DC power supply 46.

Figure 10:
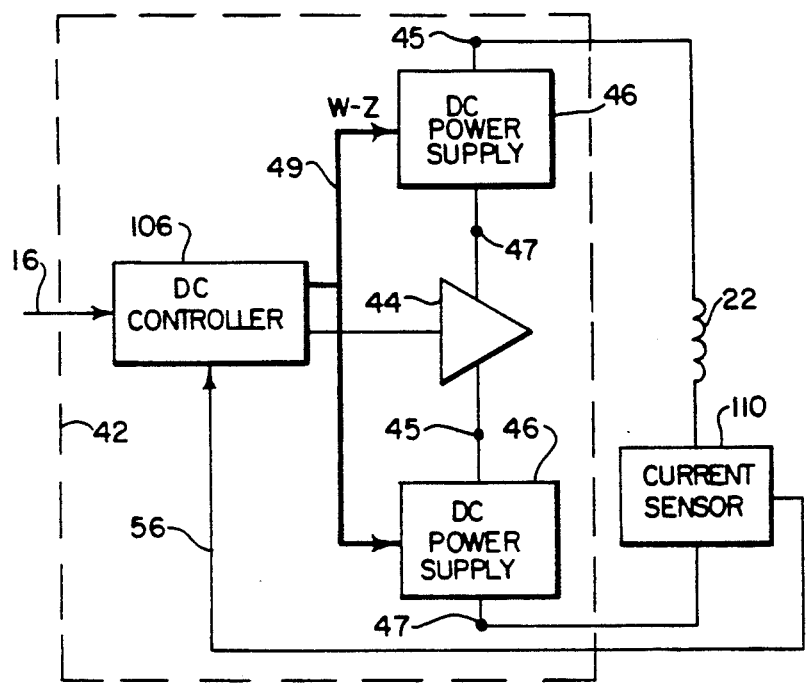
FIG. 10 is a simplified block diagram of another gradient amplifier according to the present invention.

FIG. 10 shows another embodiment of a gradient amplifier system 42 similar to that shown in FIG. 3 except the latter embodiment utilizes a single linear amplifier 44 having its outputs connects directly to each of the DC power supplies 46. In that embodiment, the current sensing resistor 50 has been eliminated and the current feedback signal 56 is produced by a high voltage current sensor 110 connected in series with the gradient coil 22.

In other embodiments, the linear amplifiers 44 can be replaced by one or two switchmode amplifiers operating at a relatively high switching frequency. For example, the DC power supplies 46 operate at a frequency of one KHz and the switchmode amplifiers operate at 500 KHz so that ripples of his frequency do not interfere with the high speed sampling of the MRI signals emitted by object 18.

Figure 11:
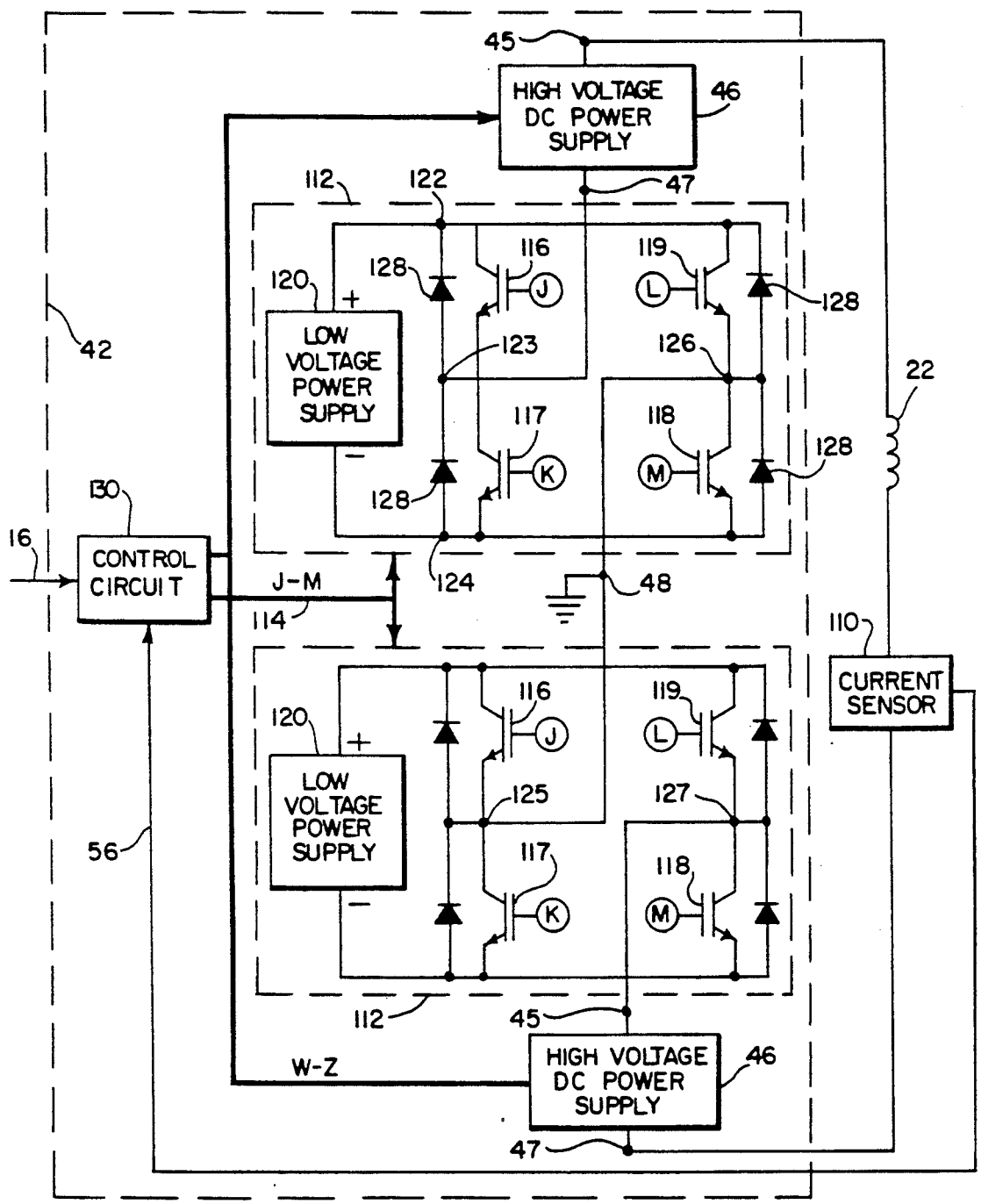
FIG. 11 is a simplified block diagram of a gradient amplifier which incorporates a pair of switchmode amplifiers as the low voltage supplies.

FIG. 11 shows one such embodiment of the gradient amplifier system 42 which utilizes a pair of switchmode amplifiers 112 connected in series between the two high voltage DC power supplies 46, in place of the two linear amplifiers 44 in the embodiment of FIG. 3. Each of the switchmode amplifiers 112 has a structure similar to that of each of the high voltage DC power supplies 46 described previously. The version of the switchmode amplifiers 112 illustrated in FIG. 11 represents the simplest embodiment in that the amplifiers 112 are capable of only three voltage outputs: zero volts and a predetermined voltage of either of two polarities. The selection of the voltage output from the switchmode amplifiers 112 is determined by four binary switching signals on bus 114 which are similar to the binary signals applied to the bases W–Z of the transistors in each of the high voltage DC power supplies 46, as described above.

Each of the switchmode amplifiers 112 includes a switching network having four N channel IGBT type power transistors 116-119 which are arranged to connect the output of a low voltage power supply 120 in series with the gradient coil 22 in either of two polarities. For example, the low voltage power supply 120 produces an output of 300 volts, whereas the high voltage supplies 46 have maximum outputs of 600 volts. The positive and negative terminals 122 and 124 respectively of the low voltage power supply 120 may be alternately connected to either a terminal of the high voltage power supply 46 or to a ground node 48 between the two switchmode amplifiers 112.

Specifically, transistors 116 and 117 are connected across the low voltage power supply 120 with the collector of transistor 116 being connected to the positive terminal 122 and its emitter is connected to the collector of transistor 117. Node 125 at the emitter of transistor 116 in one switchmode amplifier is connected to terminal 47 of one of the high voltage DC power supplies 46, whereas node 125 at the emitter of transistor 116 in the other switchmode amplifier is connected to ground node 48. The emitter of transistor 117 is connected to the negative terminal 124 of the low voltage power supply 120. Likewise, transistors 118 and 119 are also connected in series in the same manner across the output terminals 122 and 124 of the low voltage power supply 120. The node 126 between transistors 118 and 119 in one switchmode amplifier 112 is connected to the ground node 48, whereas the same node 127 in the other switchmode amplifier is connected to terminal 45 of the other high voltage DC power supply 46.

Each of the transistors 116–119 has a diode 128 arranged to conduct current from the emitter to the collector of the transistor. It will be understood from this description that the diodes 128 form a full-wave rectifier bridge, each leg of the bridge having one transistor 116–119 bridging that leg.

The base of each transistor 116–119 may be biased "on" or "off" to produce the negative polarity, positive polarity or shorted states described above with respect to the DC power supplies 46. The biasing of the transistors is determined by control circuit 30 comparing the sensed current feedback signal 56 to the desired current level and driving the switchmode amplifiers to achieve the desired current. This biasing is shown in Table I above where the letters J–M identify the bases of transistors 116–119, respectively. Thus, the switching network formed by transistors 116–119 and diodes 128 allows the output of the low voltage power supply 120 to be selectively applied to the gradient coil 22. The transistors 116–119 operating, basically either in the fully on or fully off state, consume little power and hence preserve the natural efficiency of the low voltage power supply 120 in delivering power to the gradient coil 22. The bases J–M of the four transistors 116–119 in each of the switchmode amplifiers 112 are coupled to a control circuit 130 by a parallel signal bus 114 in much the same way as the high voltage DC power supplies 46 have the bases of their transistors connected to the control circuit.

FIG. 11 illustrates a current sensor 110 connected in series with the gradient coil 22 to provide a coil current feedback signal 56 to the control circuit 130. Alternatively, a current sensing resistor may be connected between the ground node 48 and node 126 of one of the switchmode amplifiers 112 to provide a current feedback signal to the control circuit 130, in a similar manner to that shown with respect to the embodiment in FIG. 3.

Control circuit 130 responds to the analog gradient signal and current feedback signal 56 by controlling the states of the transistors to produce the appropriate voltage for gradient coil 22. In a similar manner to that described above by which the transistors in the high voltage power supply 46 are switched, control signals are applied by the control circuit via bus 114 to switch the transistors 116–119 in each of the switchmode low voltage amplifiers 112.

Figure 12:
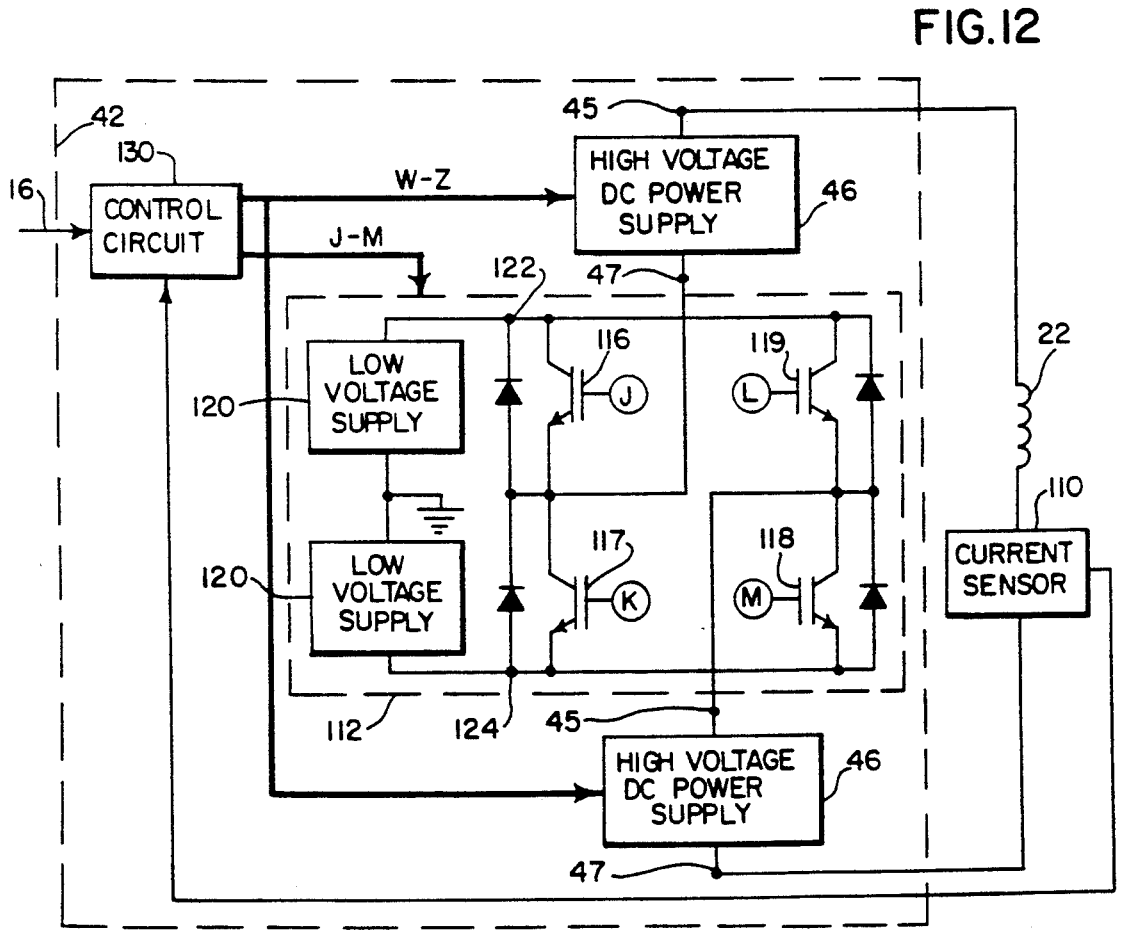
FIG. 12 is a simplified block diagram of a gradient amplifier which has a single switchmode amplifier.

FIG. 12 illustrates another version of the gradient amplifier system 42 which utilizes a single switchmode amplifier 112 in series with the two high voltage DC power supplies 46 to furnish voltage to gradient coil 22. The single switchmode amplifier 112 in this embodiment switches the output from a series connected pair of low voltage power supplies 120 to the terminals 45 and 47 of the high voltage DC power supplies 46. The operation of the single switchmode amplifier 112 is similar to that described above with respect to the dual switchmode amplifier version in FIG. 11. Specifically, a control circuit 130 generates a set of transistor switch control signals that are applied to the bases J-M of the transistors 116-119 in the switching network.

Figure 13:
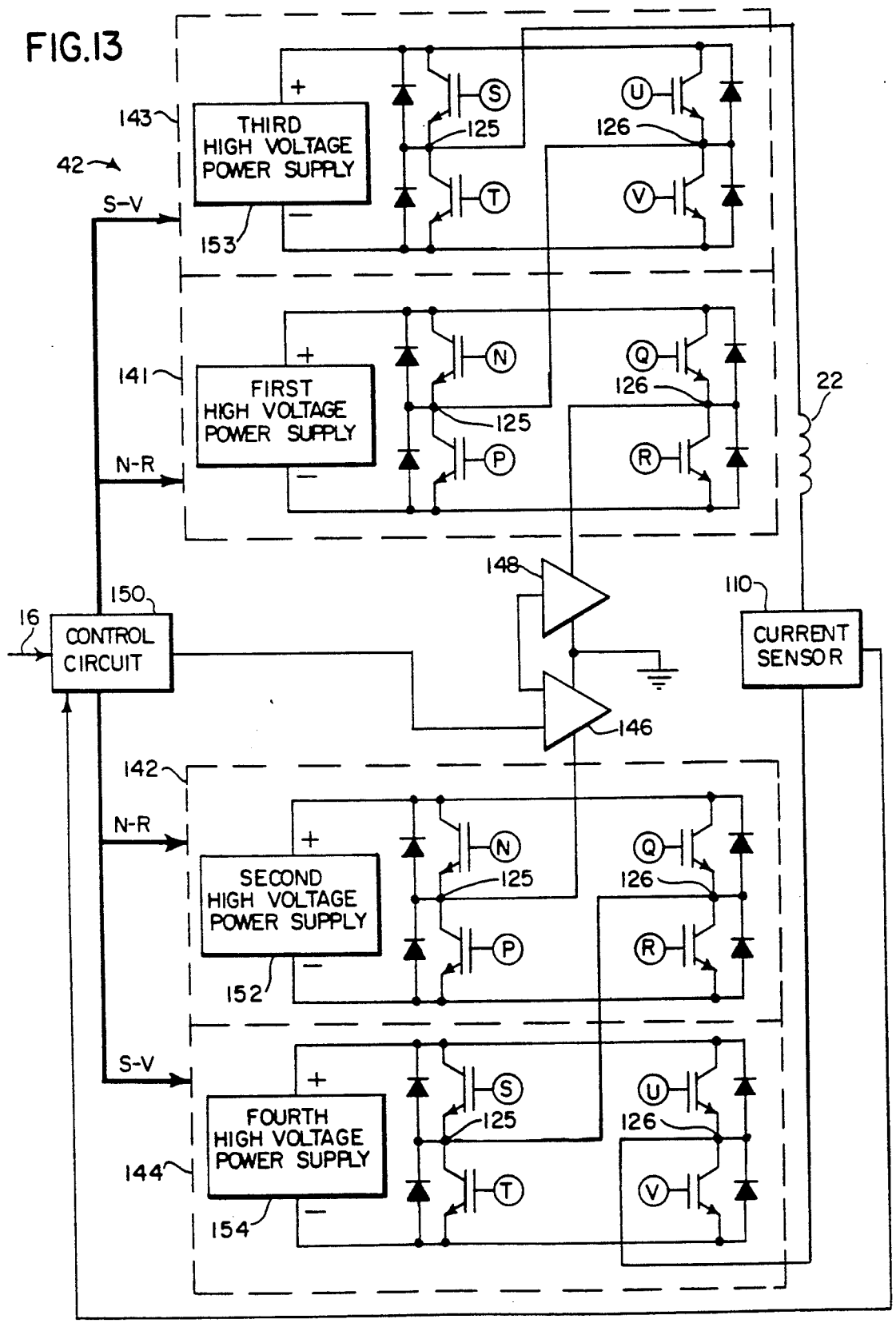
FIG. 13 is a block schematic diagram of a gradient amplifier which utilizes four high voltage power supplies.

With reference to FIG. 13, the gradient amplifier can utilize four high voltage switchmode amplifiers 141, 142, 143 and 144. Each of the four switchmode amplifiers 141-144 is similar to the ones shown in FIG. 11 and described previously. The first and second switchmode amplifiers 141 and 142 have lower voltage power supplies 151 and 152 as compared to the power supplies 153 and 154 in the third and fourth switchmode amplifiers 143 and 144. For example, high voltage power supplies 151 and 152 produce 250 volts DC across their output terminals and high voltage power supplies 153 and 154 produce 750 volts DC across their output terminals.

Node 126 of the first switchmode amplifier 141 is connected to node 125 of the second switchmode amplifier 142 by a pair of linear amplifiers 146 and 148 with their outputs connected in series between the nodes. Linear amplifier 146 has an input coupled to the output a control circuit 150 which receives the analog gradient signals 16. The other linear amplifier 147 is connected in a master/slave relationship to linear amplifier 146. Node 125 of the first switchmode amplifier 141 is connected to node 126 of the third first switchmode amplifier 143 which has its node 125 connected to the gradient coil 22. Node 126 of the second first switchmode amplifier 142 is connected to node 125 of the fourth first switchmode amplifier 144 which has its node 126 connected to the gradient coil 22 via the current sensor 110.

The bases of the transistors within the switchmode amplifiers 141-144 are biased "ON" or "OFF" by control signals N, P, Q, R, S, T, U or V to produce the negative polarity, positive polarity and shorted states described above with respect to the embodiment in FIG. 11. Specifically the switching of the transistors in the first and second switchmode amplifiers 141 and 142 is controlled by signals N, P, Q and R produced by the control circuit 150. Similarly the control circuit 150 produces signals S, T, U and V to control the transistors in the third and fourth switchmode amplifiers 143 and 144.

The above description has been that of preferred embodiments of the present invention. It will occur to those who practice the art that many modifications may be made without departing from the spirit and scope of the invention. For example, it will be understood from the above discussion that the symmetrical driving of the gradient coil 22 is not essential to the invention but that non-symmetrical configurations may be employed. In such non-symmetrical configuration, a single linear amplifier and DC power supply may be used. Or, multiple power supplies and amplifiers may be used and controlled with different signals to produce a non-symmetrical driving of the gradient coil. Further, the DC sources 94-98 may each include separate capacitor banks 64 so as to both generate and receive gradient current. In order to apprise the public of the various embodiments that may fall within the scope of the invention, the following claims are made.

The invention being claimed is:

1. An amplifier for a gradient coil of a magnetic resonance imaging system, the amplifier receiving a gradient signal and producing voltage to generate a gradient current in a gradient coil to produce a desired magnetic gradient field, the amplifier comprising:
   a DC power supply having an input for receiving the gradient signal and having an output connected to the gradient coil for impressing a first voltage component across the gradient coil, the first voltage component being selectable from a discontinuous range of output voltages and approximating the voltage needed to produce the gradient current;
   a feedback sensor connected to the gradient coil for producing a feedback signal indicative of a magnetic gradient field produced by the gradient coil; and
   an amplifier device having an output connected to the gradient coil for impressing a second voltage component across the gradient coil, the second voltage component being within a continuous range of output voltages, and having an input receiving the feedback signal and the gradient signal to adjust the second voltage component so that the sum of the first and second voltage components generates the gradient current in the gradient coil to produce the desired magnetic gradient field.

2. The amplifier as recited in claim 1 wherein the DC power supply has more than one DC source with each DC source being switchable to produce incremental voltage or zero voltage, such DC sources being connected so that the sum of the incremental voltages defines the discontinuous range of output voltages and so that the first voltage component is the sum of only the incremental voltages from those DC sources that are switched to produce an incremental voltage.

3. The amplifier as recited in claim 2 wherein the incremental voltages for each DC source differ in value between each DC source according to a binary relationship.

4. The amplifier as recited in claim 1 wherein the feedback sensor is a resistor connected in series with the gradient coil to generate a voltage proportional to the gradient current and hence to the gradient magnetic field.

5. The amplifier as recited in claim 1 wherein the DC power supply is a precharged capacitor which may be connected to or disconnected from the gradient coil to generate either a first voltage component or zero voltage.

6. The amplifier as recited in claim 5 comprising:
   a source of a reference signal that indicates a desired peak capacitor voltage; and
   an error voltage generator having a first input for receiving the reference voltage, a second input for receiving a signal representing a voltage on the capacitor, and an output coupled to the amplifier device for altering the second voltage component to move a peak voltage across the capacitor toward the desired peak capacitor voltage.

7. The amplifier as recited in claim 6 wherein the error voltage generator is gated to produce the third voltage component only during changes in the gradient current caused by changes in the first or second voltage components.

8. In a magnetic resonance imaging system, an apparatus which receives a gradient current signal and produces a corresponding gradient current in a gradient coil to generate a desired magnetic gradient field, the apparatus comprising:

a differentiator for differentiating the gradient current signal to produce a driving voltage signal;

a DC power supply having an output connected to the gradient coil for impressing, across the gradient coil, a first voltage component that is selectable from a discontinuous range of output voltages;

a digitizer for receiving the driving voltage signal and connected to the DC power supply to produce a digital switching signal to select the first voltage component from the discontinuous range of output voltages to approximate the voltage needed to generate the gradient current;

a feedback sensor connected to the gradient coil for producing a feedback signal indicative of the gradient current; and an amplifier having an output connected to the gradient coil for impressing a second voltage component across the gradient coil, the second voltage component being within a continuous range of output voltages, and the amplifier receiving and responsive to the feedback signal and the gradient signal by adjusting the second voltage component so that the sum of the first and second voltage components generates the gradient current in the gradient coil to produce the desired magnetic gradient field.

9. An apparatus for receiving a gradient signal and producing voltage to generate a current in a gradient coil of a magnetic resonance imaging system, the apparatus comprising:

a controller which produces first and second control signals from the gradient signal;

a first DC power supply having an input connected to said controller for receiving the first control signal and having first and second output terminals across which is produced a first voltage component having a magnitude adjustable in response to the first control signal, and the first output terminal being coupled to the gradient coil;

a second DC power supply having an input connected to said controller for receiving the first control signal and having third and fourth output terminals across which is produced a second voltage component having a magnitude adjustable in response to the first control signal, and the fourth output terminal being coupled to the gradient coil; and an amplifier assembly responsive to the second control signal by producing a third voltage component at an output that is connected between the second and third terminals of said first and second DC power supplies, so that the sum of the first, second and third voltage components generates the current in the gradient coil to produce the desired magnetic gradient field.

10. The apparatus as recited in claim 9 wherein at least one of said first and second DC power supplies has more than one DC source, each such DC source being switchable to produce an incremental voltage or zero voltage, the DC sources connected so that the sum of the incremental voltages define a range of output voltages and so that the corresponding first or second voltage component is the sum of only the incremental voltages from those DC sources that are switched to produce an incremental voltage.

11. The apparatus as recited in claim 10 wherein the incremental voltages for each DC source differ in value between each DC source in according to a binary relationship.

12. The apparatus as recited in claim 9 wherein each one of said first and second DC power supplies comprises:

a source of a DC voltage;

four diodes connected as a full wave rectifier bridge having positive and negative nodes connected to said source of a DC voltage and having another pair of nodes which are connected to the output terminals of said DC power supply; and four switch elements each being connected across one of said diodes and being rendered conductive in response to the second control signal.

13. The apparatus as recited in claim 9 wherein said amplifier assembly comprises a single linear amplifier.

14. The apparatus as recited in claim 9 wherein said amplifier assembly comprises a pair of linear amplifiers with outputs connected in series between the second and third terminals of said first and second DC power supplies.

15. The apparatus as recited in claim 14 wherein said amplifier assembly further comprises a current sensing resistor coupling the outputs of said pair of linear amplifiers, one end of said resistor being connected to ground and another end of said resistor being coupled to said controller to provide a signal indicative of a magnitude of current flowing through the gradient coil.

16. The apparatus as recited in claim 9 wherein said amplifier assembly comprises a single linear switchmode amplifier having a DC source that produces the third voltage component.

17. The apparatus as recited in claim 9 wherein the third voltage component is less than each of the first and second voltage components.

18. The apparatus as recited in claim 9 wherein said amplifier assembly includes a pair of switchmode amplifiers with outputs connected in series between the second and third terminals of said first and second DC power supplies.

19. The apparatus as recited in claim 18 wherein each of said switchmode amplifiers comprises:

a source of DC voltage which is less than each of the first and second voltage components;

a set of four diodes connected as a full wave rectifier bridge having positive and negative nodes connected to said DC voltage source and having another pair of nodes which form the output said switchmode amplifier; and four switch elements each being connected across one of the diodes in said set and being rendered conductive in response to the second control signal.

20. The apparatus as recited in claim 9 wherein said first and second DC power supplies select the first and second voltage components, respectively, from a group of voltage levels in response to the first control signal.

21. An apparatus for receiving a gradient signal and producing voltage to generate a current in a gradient coil of a magnetic resonance imaging system, the apparatus comprising:

a first DC power supply having an input for receiving a first control signal and having first and second output terminals across which is produced a first voltage component selectable from a group of voltage levels in response to the first control signal, and the first output terminal being coupled to the gradient coil;

a second DC power supply having an input for receiving the first control signal and having third and fourth output terminals across which is produced a second voltage component selectable from a group of voltage levels in response to the first control signal, and the fourth output terminal being coupled to the gradient coil;

a switchmode amplifier assembly responsive to a second control signal by producing a third voltage component at an output that is connected in series between the second and third output terminals of said first and second DC power supplies, so that the sum of the first, second and third voltage components generates the current in the gradient coil to produce the desired magnetic gradient field; and a controller which produces the first and second control signals from the gradient signal, and being connected to said switchmode amplifier assembly and to said first and second DC power supplies.

22. The apparatus as recited in claim 21 wherein said switchmode amplifier assembly comprises:

a first source of DC voltage which is less than each of the first and second voltage components;

a first set of four diodes connected as a full wave rectifier bridge having positive and negative nodes connected to said first source of DC voltage and having first and second output nodes; and a first quartet of switches with each switch being connected across a different diode in said first set, and being rendered conductive in response to the second control signal.

23. The apparatus as recited in claim 22 wherein said switchmode amplifier assembly further comprises:

a second source of DC voltage which is less than each of the first and second voltage components;

a second set of four diodes connected as a full wave rectifier bridge having positive and negative nodes connected to said second source of DC voltage, and having third and fourth output nodes with the third node being coupled to the second node; and a second quartet of switches with each being connected across a different diode in said second set, and being rendered conductive in response to the second control signal.

24. An apparatus for receiving a gradient signal and producing a voltage to generate a current in a gradient coil of a magnetic resonance imaging system, the apparatus, said apparatus comprising:

a controller which produces first and second control signals and an analog signal from the gradient signal;

a first DC power supply having an input connected to said controller for receiving the first control signal and having first and second output terminals across which is produced a first voltage component selectable from a plurality of voltage levels in response to the first control signal, and the first output terminal being coupled to the gradient coil;

a second DC power supply having an input connected to said controller for receiving the second control signal and having third and fourth output terminals across which is produced a second voltage component selectable from a group of voltage levels in response to the first control signal, and the third output terminal being coupled to the second output terminal of said first DC power supply;

a third DC power supply having an input connected to said controller for receiving the first control signal and having fifth and sixth output terminals across which is produced a third voltage component selectable from a plurality of voltage levels in response to the first control signal, and the fifth output terminal being coupled to the gradient coil;

a fourth DC power supply having an input connected to said controller for receiving the second control signal and having seventh and eighth output terminals across which is produced a fourth voltage component selectable from a group of voltage levels in response to the second control signal, and the seventh output terminal being coupled to the sixth output terminal of said third DC power supply; and a pair of linear amplifiers which respond to the analog signal by producing a fifth voltage component across at a pair of terminals connected between the fourth and eighth output terminals of said second and fourth DC power supplies, so that the sum of the first, second, third, fourth and fifth voltage components generates the current in the gradient coil to produce the desired magnetic gradient field.

25. The apparatus as recited in claim 24 wherein each one of said first, second, third and fourth DC power supplies comprises:

a source of a DC voltage;

four diodes connected as a full wave rectifier bridge having positive and negative nodes connected to said source of a DC voltage and having another pair of nodes which are connected to the output terminals of one of said first, second, third and fourth DC power supplies; and four switch elements each being connected across one of said diodes and being rendered conductive in response to a control signal from said controller.

* * * * *